(12) United States Patent
Kalk

(10) Patent No.: US 6,841,312 B1
(45) Date of Patent: Jan. 11, 2005

(54) METHOD AND APPARATUS FOR COUPLING A PELLICLE ASSEMBLY TO A PHOTOMASK

(75) Inventor: Franklin D. Kalk, Austin, TX (US)

(73) Assignee: DuPont Photomasks, Inc., Round Rock, TX (US)

( * ) Notice: Subject to any disclaimer, the term of this patent is extended or adjusted under 35 U.S.C. 154(b) by 330 days.

(21) Appl. No.: 10/120,935

(22) Filed: Apr. 11, 2002

Related U.S. Application Data

(60) Provisional application No. 60/283,114, filed on Apr. 11, 2001.

(51) Int. Cl.⁷ ................................................. G03F 9/00
(52) U.S. Cl. ................................ 430/5; 355/75; 428/14
(58) Field of Search ............................. 430/5; 355/75; 428/14

(56) References Cited

U.S. PATENT DOCUMENTS

| | | | |
|---|---|---|---|
| 4,637,713 A | 1/1987 | Shulenberger et al. ........ 355/76 |
| 5,616,927 A | 4/1997 | Kubota et al. ........... 250/492.2 |
| 5,693,382 A | 12/1997 | Hamada et al. ................ 428/14 |
| 5,723,860 A | 3/1998 | Hamada et al. ............. 250/239 |
| 5,772,842 A | 6/1998 | Tanaka et al. .............. 156/584 |
| 5,976,307 A | 11/1999 | Cook, Jr. .................... 156/344 |
| 6,103,427 A | * 8/2000 | Storm ........................... 430/5 |
| 6,264,773 B1 | 7/2001 | Cerio .......................... 156/64 |

OTHER PUBLICATIONS

Pending U.S. patent application Ser. No. 10/072,204 entitled "Method and Apparatus for Coupling a Pellicle to a Photomask Using a Non–Distorting Mechanism" filed Feb. 7, 2002 by Joseph S. Gordon et al. (Docket No. 064441.0227).

* cited by examiner

*Primary Examiner*—Geraldine Letscher
(74) *Attorney, Agent, or Firm*—Baker Botts L.L.P.

(57) ABSTRACT

A method and apparatus for coupling a pellicle assembly to a photomask are disclosed. A pellicle assembly is mounted on a photomask by bringing an adhesive material formed on a surface of a frame associated with the pellicle assembly in contact with the photomask. The adhesive material is heated to cause the adhesive gasket to flow and comply with a flatness of the photomask.

23 Claims, 3 Drawing Sheets

METHOD AND APPARATUS FOR COUPLING A PELLICLE ASSEMBLY TO A PHOTOMASK

CROSS REFERENCE TO RELATED APPLICATION

This application claims priority from U.S. Provisional Patent Application Ser. No. 60/283,114, filed Apr. 11, 2001 by Franklin D. Kalk, and entitled "Method and Apparatus for Coupling a Pellicle Frame to a Photomask Substrate."

TECHNICAL FIELD OF THE INVENTION

This invention relates in general to the field of photolithography and, more particularly, to a method and apparatus for coupling a pellicle assembly to a photomask.

BACKGROUND OF THE INVENTION

Today, photolithography requires short exposure wavelengths for successful imaging of very small semiconductor device dimensions on a wafer. At wavelengths in or below the deep ultraviolet (DUV) range, e.g., below approximately 300 nanometers, the materials used to produce a photomask assembly have become increasingly important. At these shorter wavelengths, the light in a photolithography system has more energy and can be destructive to a photomask assembly manufactured with conventional materials.

A conventional photomask assembly generally includes a photomask, also known as a reticle or mask, and at least one pellicle assembly that covers a patterned side of the photomask. A standard photomask includes a patterned layer of opaque or partially transmissive material formed on a transparent substrate. A pellicle assembly typically includes a thin film attached to a frame. The thin film acts as a cover that keeps contaminants off an adjacent surface of the photomask during a lithography process. The pellicle frame is typically mounted on the photomask with an annular shaped adhesive gasket that is attached to the bottom and around the perimeter of the pellicle frame.

At DUV wavelengths and below, flatness of the photomask is a concern. Existing pellicle mounting techniques often use pressure to create a seal between the pellicle frame, the gasket and the transparent substrate. Before the pellicle is mounted on the transparent substrate, the pellicle frame may contain up to approximately one hundred microns of warp. In contrast, the transparent substrate typically contains less than approximately two microns of warp before pellicle mounting. Since the pellicle frame warp frequently exceeds the mask warp, voids may be created between the gasket, the pellicle assembly and the photomask.

In order to eliminate the voids and create a more complete seal, a pellicle pressing tool is sometimes used. Typically, a force of twenty-five to fifty pounds may be applied to the pellicle frame, which yields a pressure at the interface of the frame, the gasket and the photomask of approximately fifteen to thirty pounds per square inch (psi). This force compresses the adhesive gasket and presses the frame against the mask to complete the seal.

During mounting, any warp in the pellicle frame may be overcome to completely seal the gasket to the frame and the photomask. The frame attempts to return to its original shape when the pressure is removed, which causes photomask distortion. The photomask assembly eventually reaches an equilibrium, but the frame and photomask remain in a stressed state. Over time, this stress causes the flatness of the photomask to degrade and can cause registration errors on a wafer during a semiconductor manufacturing process.

SUMMARY OF THE INVENTION

In accordance with the teachings of the present invention, disadvantages and problems associated with coupling a pellicle assembly to a photomask substrate have been substantially reduced or eliminated. In a particular embodiment, a method for coupling a pellicle assembly to a photomask substrate includes heating an adhesive gasket such that a flatness of the adhesive gasket's surface that contacts a photomask is approximately equal to a flatness of the photomask.

In accordance with one embodiment of the present invention, a method for coupling a pellicle assembly to a photomask includes mounting a pellicle assembly on a photomask by placing an adhesive gasket formed on a surface of a frame associated with the pellicle assembly in contact with the photomask. The adhesive gasket is heated to cause the adhesive gasket to flow and comply with a flatness of the photomask.

In accordance with another embodiment of the present invention, a photomask assembly includes a pellicle assembly coupled to a photomask by an adhesive gasket. The pellicle assembly includes a thin film coupled to a first surface of a frame and an adhesive gasket formed on a second surface of the frame. The adhesive gasket may be heated to create a seal between the pellicle assembly and the photomask.

In accordance with a further embodiment of the present invention, a pellicle assembly includes a thin film attached to a first surface of a frame and an adhesive gasket formed on a second surface of the frame. The adhesive gasket may be heated to couple the pellicle assembly to a photomask and to create a seal between the pellicle assembly and the photomask.

Important technical advantages of certain embodiments of the present invention include an adhesive gasket that eliminates the need to apply a large force when mounting a pellicle assembly on a photomask. During mounting, the adhesive gasket is heated so that it flows to fill in any gaps that are present due to the difference in flatness or warp between the pellicle assembly and the photomask. A complete seal, therefore, is created between the pellicle assembly and the photomask without using any pressure and without changing a flatness associated with the pellicle assembly or the photomask.

Another important technical advantage of certain embodiments of the present invention includes a gasket that reduces the number of registration errors on a wafer during a semiconductor manufacturing process. Heat, rather than pressure, is used to create a complete seal between a pellicle assembly and a photomask during a mounting process. Typically, pressure introduces stress into a photomask assembly formed by the pellicle assembly and the photomask. The added stress can cause photomask distortion, which can create registration errors on a wafer. By using heat to create the seal, no additional stress is introduced into the photomask assembly and the amount of photomask distortion that can occur over time may be reduced.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein.

DETAILED DESCRIPTION

Preferred embodiments of the present invention and their advantages are best understood by references to FIGS. 1A through 4C, where like numbers are used to indicate like and corresponding parts.

Figure 1A:
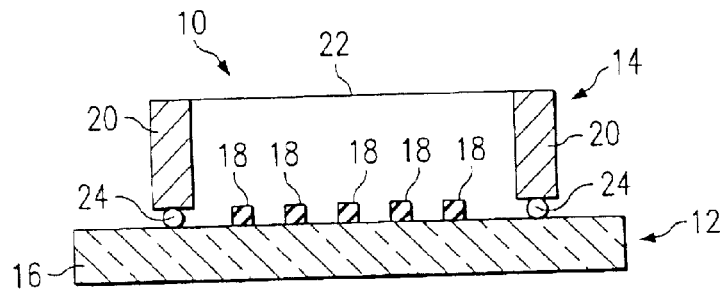
FIG. 1A illustrates a cross-sectional view of a photomask assembly before heat is applied to an adhesive gasket that couples a pellicle assembly to a photomask in accordance with the teachings of the present invention.
Figure 1B:
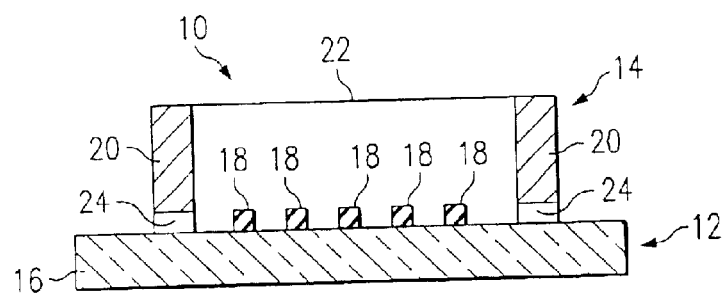
FIG. 1B illustrates a cross-sectional view of the photomask assembly of FIG. 1A after heat is applied to the adhesive gasket.

FIGS. 1A and 1B respectively illustrate cross-sectional views of photomask assembly 10 before and after heat is applied to adhesive gasket 24. Photomask assembly 10 includes photomask 12 coupled to pellicle assembly 14 by adhesive gasket 24. Substrate 16 and patterned layer 18 form photomask 12, otherwise known as a mask or reticle, that may have a variety of sizes and shapes, including but not limited to round, rectangular, or square. Photomask 12 may also be any variety of photomask types, including, but not limited to, a one-time master, a five-inch reticle, a six-inch reticle, a nine-inch reticle or any other appropriately sized reticle that may be used to project an image of a circuit pattern onto a semiconductor wafer. Photomask 12 may further be a binary mask, a phase shift mask (PSM), an optical proximity correction (OPC) mask or any other type of mask suitable for use in a lithography system.

Photomask 12 includes patterned layer 18 formed on substrate 16 that, when exposed to electromagnetic energy in a lithography system, projects a pattern onto a surface of a semiconductor wafer (not expressly shown). Substrate 16 may be a transparent material such as quartz, synthetic quartz, fused silica, magnesium fluoride ($MgF_2$), calcium fluoride ($CaF_2$), or any other suitable material that transmits at least seventy-five percent (75%) of incident light having a wavelength between approximately 100 nanometers (nm) and approximately 450 nm. In an alternative embodiment, substrate 16 may be a reflective material such as silicon or any other suitable material that reflects greater than approximately fifty percent (50%) of incident light having a wavelength between approximately 100 nm and 450 nm.

Patterned layer 18 may be a metal material such as chrome, chromium nitride, a metallic oxy-carbo-nitride (M—O—C—N), where the metal is selected from the group consisting of chromium, cobalt, iron, zinc, molybdenum, niobium, tantalum, titanium, tungsten, aluminum, magnesium and silicon, and any other suitable material that absorbs electromagnetic energy with wavelengths in the ultraviolet (UV) range, deep ultraviolet (DUV) range, vacuum ultraviolet (VUV) range and extreme ultraviolet range (EUV). In an alternative embodiment, patterned layer 18 may be a partially transmissive material, such as molybdenum silicide (MoSi), which has a transmissivity of approximately one percent to approximately thirty percent (30%) in the UV, DUV, VUV and EUV ranges.

Frame 20, pellicle film 22 and adhesive gasket 24 form pellicle assembly 14. Frame 20 is typically formed of anodized aluminum, although it could alternatively be formed of stainless steel, plastic or other suitable materials. Pellicle film 22 may be a thin film membrane formed of a material such as nitrocellulose, cellulose acetate, an amorphous fluoropolymer, such as Teflon® AF manufactured by E. I. du Pont de Nemours and Company or Cytop® manufactured by Asahi Glass, or another suitable film that is transparent to wavelengths in the UV, DUV, EUV and VUV ranges. Pellicle film 22 may be prepared by a conventional technique such as spin casting.

Pellicle film 22 protects photomask 12 from dust particles by ensuring that the dust particles remain a defined distance away from photomask 12. This may be especially important in a lithography system. During photolithography, photomask assembly 10 is exposed to electromagnetic energy produced by a radiant energy source within the photolithography system. The electromagnetic energy may include light of various wavelengths, such as wavelengths approximately between the I-line and G-line of a Mercury arc lamp, or DUV, VUV or EUV light. In operation, pellicle film 22 is designed to allow a large percentage of the electromagnetic energy to pass through it. Dust particles collected on pellicle film 22 will likely be out of focus at the surface of the wafer being processed and the exposed image on the wafer should be clear. Pellicle film 22 formed in accordance with the teachings of the present invention may be satisfactorily used with all types of electromagnetic energy and is not limited to lightwaves as described in this application.

Adhesive gasket 24 functions to couple pellicle assembly 14 to photomask 12 without introducing any stress on photomask 12 associated with conventional techniques for mounting a pellicle assembly on a photomask. As shown in FIG. 1A, adhesive gasket 24 may be applied to frame 20 in a bead form. When pellicle assembly 14 is initially placed on photomask 12, voids and/or gaps that can allow contaminants to reach patterned layer 18 may be present between adhesive gasket 24 and photomask 12 because the warp, also know as the flatness, associated with pellicle assembly 14 (e.g., approximately one-hundred microns) is much larger than the warp associated with photomask 12 (e.g., approximately one micron).

Conventional mounting techniques remove any voids by pressing pellicle assembly 14 and photomask 12 together with a large force (e.g., twenty to seventy pounds) to create a complete seal between pellicle assembly 14 and photomask 12. During the mounting process, stresses are often introduced in pellicle assembly 14 in order to reduced the amount of warp associated with pellicle assembly 14. When the force is removed, pellicle assembly 14 attempts to return to its original state and thus, creates stress in photomask assembly 10. The stress introduced by pellicle assembly 14 may cause the flatness of photomask 12 to degrade over time.

In contrast, the present invention eliminates the need for a large force by using heat to cause the material in adhesive gasket 24 to flow and fill in any voids that may be present. During the mounting process, pellicle assembly 14 remains in its initial state and adhesive gasket 24 complies with a flatness or warp associated with both pellicle assembly 14 and photomask 12. Pellicle assembly 14, therefore, does not introduce any additional stress into photomask assembly 10 and may prevent or reduce distortion in photomask 12.

In one embodiment, adhesive gasket 24 is a thermoplastic adhesive, such as SMARTBOND™ produced by Triton Systems, Inc. In other embodiments, adhesive gasket 24 may be any suitable thermoplastic adhesive polymer that has a glass transition temperature greater than 30° C. and less than the glass transition temperature of pellicle film 22 and the adhesive (not expressly shown) that bonds pellicle film 22 to frame 20. Adhesive gasket 24 further may be impregnated with ferromagnetic particles (not expressly shown) that are suspended in a polymer matrix. The ferromagnetic particles in adhesive gasket 24 may respond to an alternating current magnetic field applied across the top surface of photomask 12 and allow the controlled bonding of adhesive gasket 24. As illustrated in FIG. 1A, adhesive gasket 24 may be applied to frame 20 in a bead. Pellicle assembly 14 may be placed on photomask 12 such that adhesive gasket 24 is located between frame 20 and the top surface of photomask 12. The bottom surface of adhesive gasket 24 adheres to the top surface of photomask 12 to hold pellicle assembly 14 in place.

An alternating current magnetic field may be applied to photomask assembly 10 across the top surface of photomask 12 and adhesive gasket 24. The magnetic field causes the temperature of the ferromagnetic particles to increase and melt adhesive gasket 24. The ferromagnetic particles may have a Curie temperature that is equal to or a few degrees greater than the temperature at which adhesive gasket 24 begins to flow. When the temperature of the ferromagnetic particles is at or near the Curie temperature, the ferromagnetic particles lose their magnetic properties and stop heating adhesive gasket 24. The temperature of adhesive gasket 24, therefore, does not greatly exceed the flow temperature for the material in adhesive gasket 24, and prevents adhesive gasket 24 from overheating. In one embodiment, the size and composition of the ferromagnetic particles, and the strength and frequency of the magnetic field, are chosen so that the ferromagnetic particles are efficiently heated while any metal parts or films in photomask assembly 12 are not heated. Only adhesive gasket 24, therefore, is heated, which minimizes distortion of photomask 12 and frame 20 away from their initial, undistorted states.

In one embodiment, the magnetic field may be turned on for approximately two seconds to approximately five seconds. While the magnetic field is active, the ferromagnetic particles heat adhesive gasket 24 and cause adhesive gasket 24 to flow enough to create a seal between pellicle assembly 14 and photomask 12. When the magnetic field is turned off, adhesive gasket 24 cools and completes the seal, as shown in FIG. 1B. The bottom surface of adhesive gasket 24, therefore, has a flatness approximately equal to the flatness of photomask 12. In one embodiment, photomask 12 may be a six-inch reticle that has a thickness of approximately one-quarter inch and a flatness of less than approximately one micron. In another embodiment, photomask 12 may be a five-inch reticle that has a thickness of approximately 0.09 inches and a flatness of less than approximately two microns.

In another embodiment, adhesive gasket 24 may be heated by using an infrared laser (not expressly shown). A laser beam from the laser may be directed toward adhesive gasket 24. When the laser beam comes in contact with adhesive gasket 24, the temperature of adhesive gasket increases and the material in adhesive gasket 24 begins to flow. The laser beam may applied to the perimeter of adhesive gasket 24 until any voids or gaps are removed and a seal is formed between pellicle assembly 14 and photomask 12. For example, the laser beam may be applied to each part of adhesive gasket 24 for approximately one second to approximately five seconds.

In a further embodiment, adhesive gasket 24 may be heated by heating frame 20 with a heat source. Since frame 20 may be made of a thermally conductive material, such as anodized aluminum, frame 20 may transfer heat to adhesive gasket 24. The heat may cause adhesive gasket 24 to flow and create a complete seal around the perimeter of frame 20 between pellicle assembly 14 and photomask 12. The heat source may be an induction heater, a wire or film resistance heater or any other suitable device that increases the temperature of frame 20.

Figure 2A:
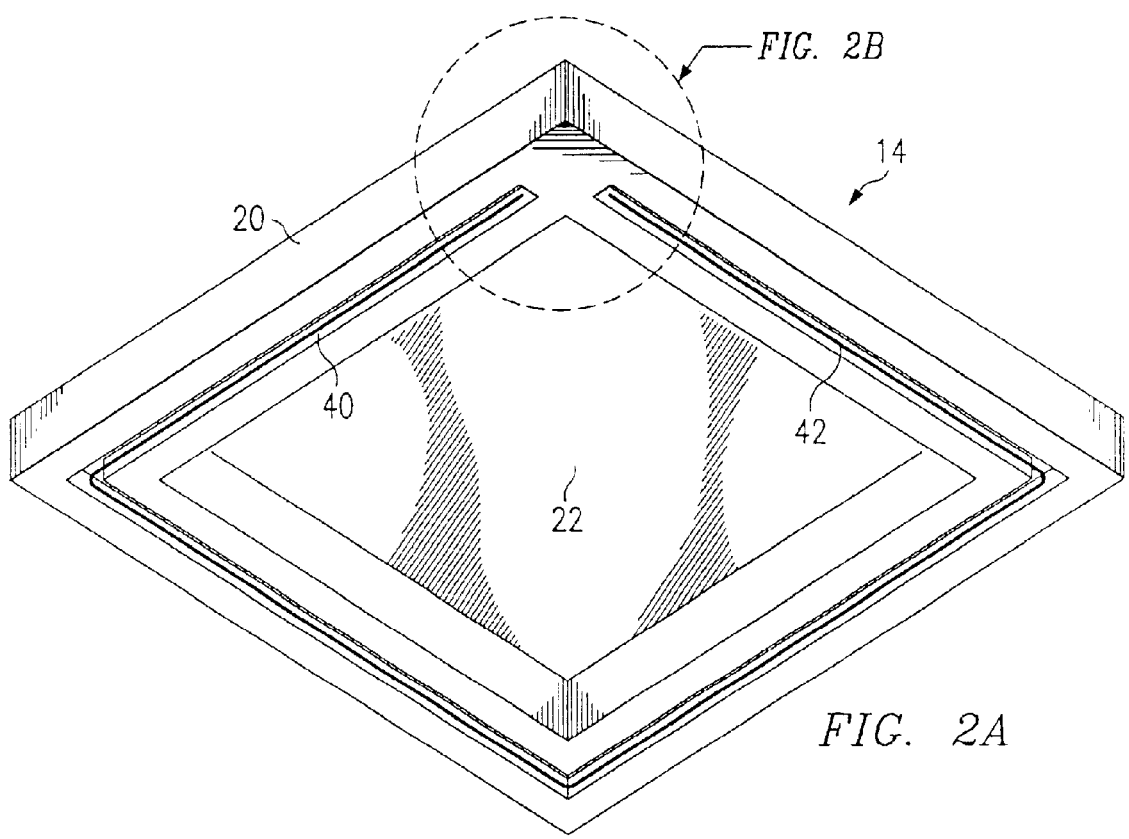
FIG. 2A illustrates a bottom perspective view of a pellicle assembly that includes a slot with a wire that conducts current in accordance with the teachings of the present invention.
Figure 2B:
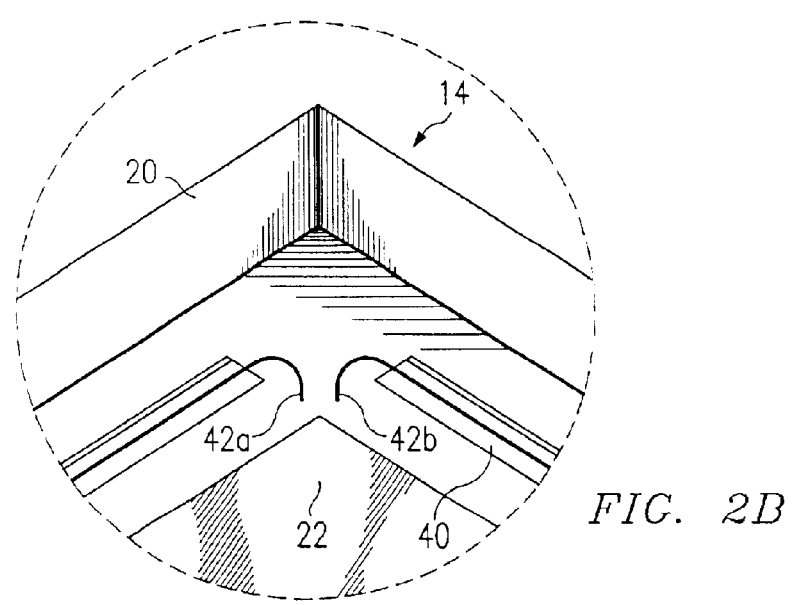
FIG. 2B illustrates a schematic drawing with portions broken away showing a bottom perspective view of the pellicle assembly of FIG. 2A.

FIGS. 2A and 2B respectively illustrate a bottom perspective view and a schematic drawing with portions broken away of a bottom perspective view of pellicle assembly 14 that includes one embodiment of a heat source. Pellicle assembly 14 may include slot 40 that is formed in the bottom surface of frame 20. Slot 40 may contain wire 42 that may be used to conduct a current and heat adhesive gasket 24. Wire 42 may be a metal, including but not limited to, tungsten, nichrome, or any other suitable material that may be used to conduct a current and generate heat.

As shown in FIG. 2B, wire 42 may include leads 42a and 42b that extend outside of slot 40 and may be connected to a current source (not expressly shown). When the current source is turned on, wire 42 may conduct a current, which creates heat in wire 42. The heat may be transferred to adhesive gasket 24 through conduction, convection or any other suitable heat transfer method such that the temperature of adhesive gasket 24 increases and adhesive gasket 24 begins to flow. The current source may be used for a suitable amount of time (e.g., approximately two seconds to approximately five seconds) until adhesive gasket 24 flows to remove any voids that may exist between adhesive gasket 24 and pellicle assembly 14 and/or photomask 12.

Figure 3:
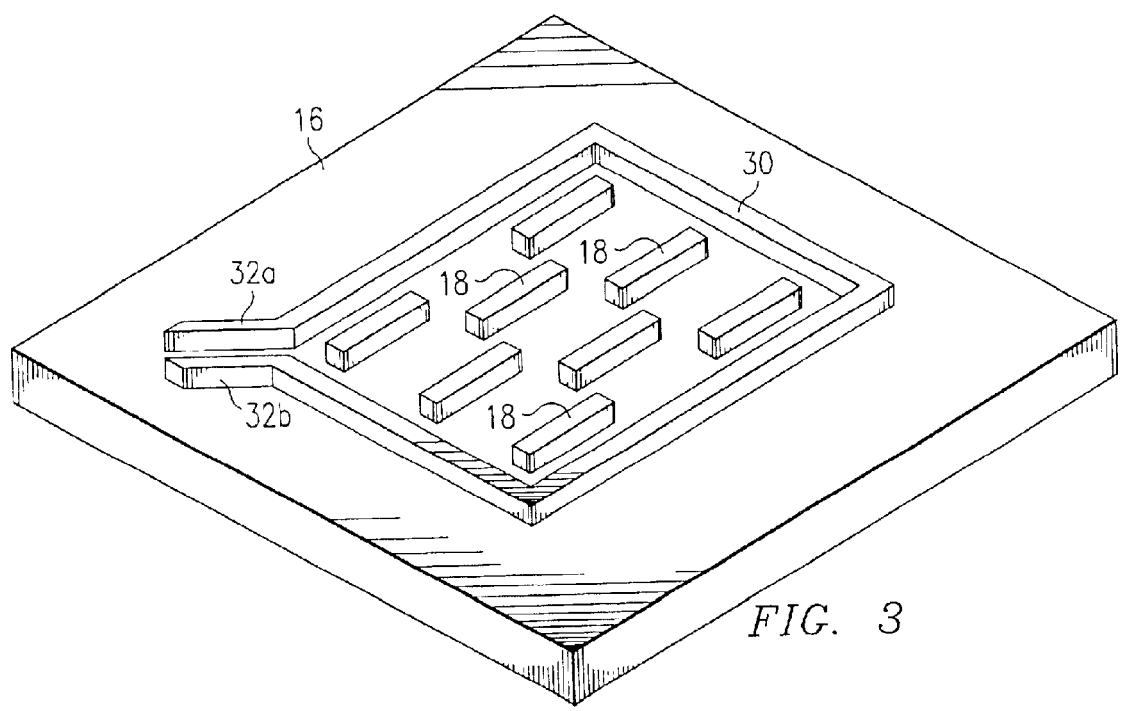
FIG. 3 illustrates a top perspective view of a photomask that includes a conductive layer formed on a substrate for conducting current in accordance with the teachings of the present invention.

FIG. 3 illustrates a top perspective view of photomask 12 that includes another embodiment of a heat source. As illustrated in FIG. 1A, pellicle assembly 14 may be mounted on photomask 12 by adhesive gasket 24. Conductive layer 30 may be formed on photomask 12 such that it is located under adhesive gasket 24, outside of a perimeter of adhesive gasket 24 or any other suitable location on photomask 12 that allows conductive layer 30 to heat adhesive gasket 24.

Conductive layer 30 includes leads 32a and 32b that may be connected to a current source (not expressly shown). When the current source is turned on, conductive layer 30 may conduct a current, which creates heat in conductive layer 30. The heat may be transferred to adhesive gasket 24 through conduction or any other suitable heat transfer method such that the temperature of adhesive gasket 24 increases and adhesive gasket 24 begins to flow. The current source may be used for a suitable amount of time (e.g., approximately two seconds to approximately five seconds) so that adhesive gasket 24 flows to remove any voids that may exist between adhesive gasket 24 and pellicle assembly 14 and/or photomask 12. Conductive layer 30 may be a metal, including but not limited to, aluminum, copper, and chrome, or any other suitable material that may be used to conduct a current.

Figure 4A:
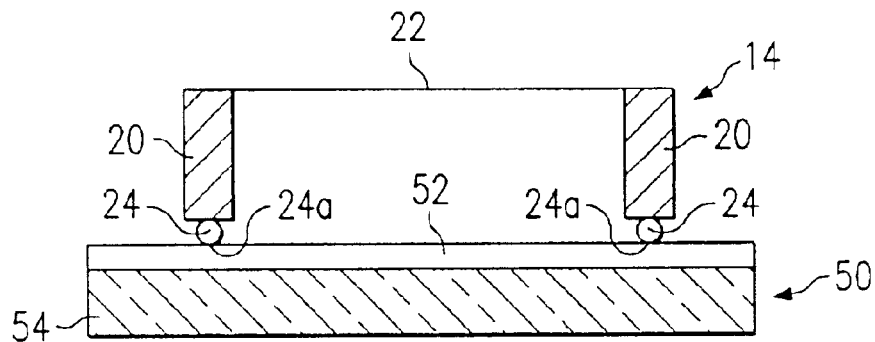
FIG. 4A illustrates a cross-sectional view of a pellicle assembly placed on a substrate before heat is applied to an adhesive gasket attached to the pellicle assembly in accordance with the teachings of the present invention.
Figure 4B:
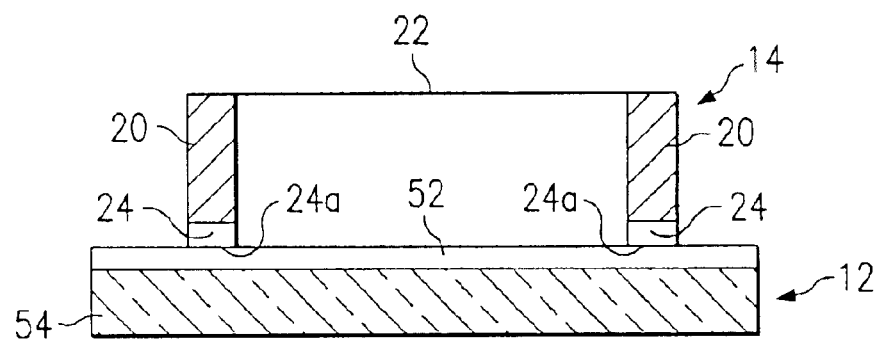
FIG. 4B illustrates a cross-sectional view of the pellicle assembly and the substrate of FIG. 4A after heat is applied to the adhesive gasket.

FIGS. 4A and 4B respectively illustrate a cross-sectional view of pellicle assembly 14 and mounting base 50 before and after heat is applied to adhesive gasket 24. Mounting base 50 may include non-adhesive layer 52 formed on base 54. Non-adhesive layer 52 may be Teflon®, Cytop® or any other suitable material that provides sufficient non-adhesive properties. Base 54 may be formed from quartz, synthetic quartz, fused silica, $MgF_2$, $CaF_2$ or any other suitable material used for substrate 16, or any other material that has a flatness of approximately three microns to approximately 0.3 microns. Non-adhesive layer 52 may be a film applied by, for example, spin casting, such that non-adhesive layer 52 does not affect the flatness properties of base 54. The exposed surface of non-adhesive layer 52, therefore, will have a flatness approximately equal to the flatness of base 54. The thickness of non-adhesive layer 52 may be approximately 0.3 microns to approximately three microns or any other thickness suitable for imparting the properties associated with non-adhesive layer 52 to base 54 without significantly affecting the flatness of base 54.

In one embodiment, adhesive gasket 24 may be applied to the bottom surface of frame 20 and pellicle assembly 14 may be placed on non-adhesive layer 52 of mounting base 50. Similar to the embodiment described above in reference to FIG. 1A, pellicle assembly 14 may have a warp that is much larger than the warp associated with mounting base 50. The difference in the warps may cause gaps or voids to be present between surface 24a of adhesive gasket 24 and the adjacent surface of non-adhesive layer 52. The gaps or voids may be removed by heating adhesive gasket 24 and causing the material in adhesive gasket 24 to flow.

Referring now to FIG. 4B, heat is applied to adhesive gasket 24 so that adhesive gasket 24 complies with the flatness associated with mounting base 50. In one embodiment, mounting base 50 may be placed on a hot plate (not expressly shown) that heats mounting base 50. The heat is transferred through base 54 and non-adhesive layer 52 to provide heat to adhesive gasket 24. As the temperature of adhesive gasket 24 increases, the material in adhesive gasket 24 begins to flow and eliminates the gaps between adhesive gasket 24 and the adjacent surface of non-adhesive layer 52. The hot plate may be turned off when adhesive gasket 24 is contacting non-adhesive layer 52 around the perimeter of frame 20. In one embodiment, the hot plate may be used for approximately two seconds to approximately five seconds in order to provide enough heat for adhesive gasket 24 to flow.

In alternative embodiments, heat may be provided by using any one of the heating techniques described above in reference to FIG. 1. For example, adhesive gasket 24 may be impregnated with ferromagnetic particles and heated by applying a magnetic field across the top surface of mounting base 50 to increase the temperature of the ferromagnetic particles, a laser beam may be directed toward adhesive gasket 24, or a heat source may be attached to frame 20.

Figure 4C:
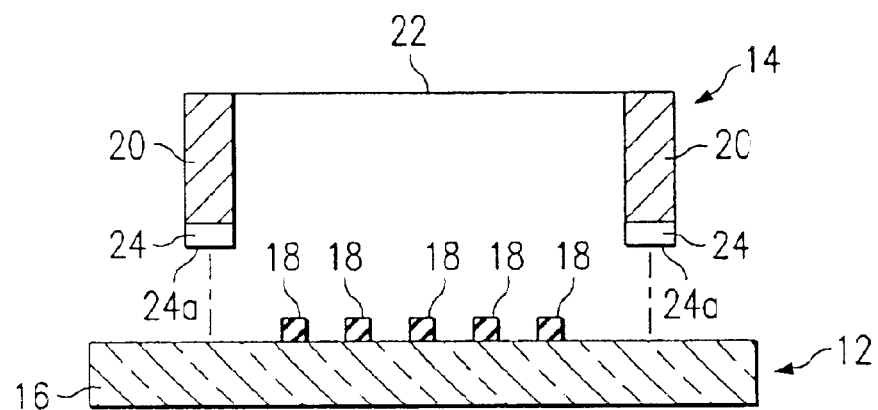
FIG. 4C illustrates a cross-sectional view of a photomask assembly that includes the pellicle assembly of FIG. 4B mounted on a photomask.

FIG. 4C illustrates a cross-sectional view of photomask assembly 10 after heat has been applied to adhesive gasket 24 on pellicle assembly 14. Once adhesive gasket 24 satisfactorily cools, pellicle assembly 14 may be removed from the surface of mounting base 50 and mounted on photomask 12. Pellicle assembly 14 will generally maintain the amount of warp present in frame 20 before heating. Surface 24a of adhesive gasket 24, however, has a flatness approximately equal to the flatness of non-adhesive layer 52 and mounting base 50. In one embodiment, the flatness of mounting base 50 may be approximately equal to the flatness of photomask 12 such that when pellicle assembly 14 is mounted on photomask 12, a complete seal is formed between photomask assembly 14 and photomask 12.

Although the present invention has been described in detail, it should be understood that various changes, substitutions, and alterations can be made without departing from the spirit and scope of the invention as defined by the appended claims.

What is claimed is:

1. A method for coupling a pellicle assembly to a photomask, comprising:
   mounting a pellicle assembly on a photomask by placing an adhesive gasket formed on a surface of a frame associated with the pellicle assembly in contact with a selected portion of the photomask; and
   heating the adhesive gasket to cause the adhesive gasket to flow and comply with a flatness of the photomask.

2. The method of claim 1, further comprising heating the ferromagnetic particles by applying a magnetic field across the adhesive gasket to heat ferromagnetic particles disposed in the adhesive gasket.

3. The method of claim 2, further comprising heating the adhesive gasket to a Curie temperature approximately equal to a flow temperature associated with the adhesive gasket.

4. The method of claim 1, further comprising heating the adhesive gasket by applying a current to a conductive layer formed on the photomask.

5. The method of claim 1, further comprising heating the adhesive gasket by applying a laser to the adhesive gasket.

6. The method of claim 1, further comprising heating the adhesive gasket by applying a current to a metal wire disposed in the frame.

7. The method of claim 1, further comprising heating the adhesive gasket by applying a heat source to the frame.

8. The method of claim 1, further comprising creating a seal between the pellicle assembly and the photomask by allowing the adhesive gasket to cool.

9. The method of claim 1, wherein mounting the pellicle assembly on the photomask occurs before heating the adhesive gasket.

10. The method of claim 1, wherein heating the adhesive gasket occurs before mounting the pellicle assembly on the photomask.

11. The method of claim 10, wherein heating the adhesive gasket comprises:
    mounting the pellicle assembly on a non-adhesive layer of a mounting base including a flatness approximately equal to the flatness of the photomask;
    heating the mounting plate to cause the adhesive gasket to flow and comply with the flatness of the mounting base; and
    removing the pellicle assembly from the mounting base when the adhesive gasket cools.

12. A photomask assembly, comprising:
    a pellicle assembly including a thin film coupled to a first surface of a frame;
    an adhesive gasket formed on a second surface of the frame, the second surface of the frame located opposite the first surface of the frame; and
    a photomask coupled to the pellicle assembly by heating the adhesive gasket, the adhesive gasket operable to create a seal between the pellicle assembly and the photomask.

13. The photomask assembly of claim 12, further comprising the adhesive gasket impregnated with ferromagnetic particles.

14. The photomask assembly of claim 13, further comprising a magnetic field applied across the adhesive gasket, the magnetic field operable to heat the ferromagnetic particles to a Curie temperature approximately equal to a flow temperature associated with the adhesive gasket.

15. The photomask assembly of claim 12, further comprising a conductor formed on the photomask proximate the frame, the conductor operable to conduct a current to heat the adhesive gasket.

16. The photomask assembly of claim 12, further comprising the pellicle assembly including a metal wire located in a slot formed in the second surface of the frame, the metal wire operable to conduct a current and cause the adhesive gasket to flow and comply with a flatness of the photomask.

17. The photomask assembly of claim 12, wherein the adhesive gasket is a thermoplastic polymer including a glass transition temperature above approximately 30° C.

18. A pellicle assembly, comprising:
 a frame including a first surface located opposite a second surface;
 a thin film attached to the first surface of the frame; and
 an adhesive gasket formed on the second surface of the frame, the adhesive gasket operable to be heated to couple the pellicle assembly to a photomask and to create a seal between the pellicle assembly and the photomask.

19. The pellicle assembly of claim 18, further comprising the adhesive gasket impregnated with ferromagnetic particles.

20. The pellicle assembly of claim 19, further comprising a magnetic field applied across the adhesive gasket, the magnetic field operable to heat the ferromagnetic particles to a Curie temperature approximately equal to a flow temperature associated with the adhesive gasket.

21. The pellicle assembly of claim 18, further comprising the pellicle assembly including a metal wire located in a slot formed in the second surface of the frame, the metal wire operable to conduct a current to heat the adhesive gasket.

22. The pellicle assembly of claim 18, further comprising a heat source coupled to the frame, the heat source operable to heat the frame and cause the adhesive gasket to flow and comply with a flatness of the photomask.

23. The pellicle assembly of claim 18, wherein the adhesive gasket is a thermoplastic polymer including a glass transition temperature above approximately 30° C.

\* \* \* \* \*